(12) United States Patent
Andoh et al.

(10) Patent No.: US 6,927,141 B2
(45) Date of Patent: Aug. 9, 2005

(54) PROCESS FOR FORMING FAST RECOVERY DIODE WITH A SINGLE LARGE AREA P/N JUNCTION

(75) Inventors: Kohji Andoh, El Segundo, CA (US); Silvestro Fimiani, Turin (IT); Fabrizio Ruo Redda, El Segundo, CA (US); Davide Chiola, Marina del Ray, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/642,837

(22) Filed: Aug. 18, 2003

(65) Prior Publication Data

US 2004/0077305 A1 Apr. 22, 2004

Related U.S. Application Data

(62) Division of application No. 10/115,757, filed on Apr. 2, 2002.
(60) Provisional application No. 60/280,972, filed on Apr. 2, 2001.

(51) Int. Cl.[7] .............................................. H01L 21/20
(52) U.S. Cl. ........................ 438/380; 438/454; 438/514; 438/533; 438/543; 438/669; 438/672
(58) Field of Search .............................. 438/380, 454, 438/514, 531, 533, 543, 669, 672

(56) References Cited

U.S. PATENT DOCUMENTS

| | | | | |
|---|---|---|---|---|
| 4,009,483 A | * | 2/1977 | Clark ........................ 257/489 |
| 4,220,963 A | * | 9/1980 | Rumennik ................. 257/619 |
| 4,567,502 A | | 1/1986 | Nakagawa et al. .......... 257/53 |
| 4,862,229 A | | 8/1989 | Mundy et al. ............... 357/15 |
| 4,901,120 A | | 2/1990 | Weaver et al. .............. 357/14 |
| 4,925,812 A | * | 5/1990 | Gould ........................ 438/543 |
| 5,283,202 A | * | 2/1994 | Pike et al. .................. 438/543 |
| 5,466,612 A | * | 11/1995 | Fuse et al. .................. 438/60 |
| 5,523,604 A | | 6/1996 | Merrill ...................... 257/356 |
| 5,552,625 A | * | 9/1996 | Murakami et al. ......... 257/409 |
| 5,859,465 A | | 1/1999 | Spring et al. .............. 257/484 |
| 6,197,649 B1 | * | 3/2001 | Francis et al. ............. 438/380 |
| 6,222,248 B1 | | 4/2001 | Fragapane ................. 257/565 |
| 6,441,455 B1 | * | 8/2002 | Dutta ......................... 257/490 |
| 2002/0171093 A1 | * | 11/2002 | Onishi et al. .............. 257/197 |

FOREIGN PATENT DOCUMENTS

| | | |
|---|---|---|
| EP | 001033756 | 9/2000 |
| JP | 200082825 | 3/2000 |
| JP | 02000114550 | 4/2000 |
| JP | 2002033326 | 7/2000 |

* cited by examiner

Primary Examiner—Mary Wilczewski
Assistant Examiner—Toniae M. Thomas
(74) Attorney, Agent, or Firm—Ostrolenk, Faber, Gerb & Soffen, LLP

(57) ABSTRACT

A fast recovery diode has a single large area P/N junction surrounded by a termination region. The anode contact in contact with the central active area extends over the inner periphery of an oxide termination ring and an EQR metal ring extends over the outer periphery of the oxide termination ring. Platinum atoms are diffused into the back surface of the device. A three mask process is described. An amorphous silicon layer is added in a four mask process, and a plurality of spaced guard rings are added in a five mask process.

6 Claims, 2 Drawing Sheets

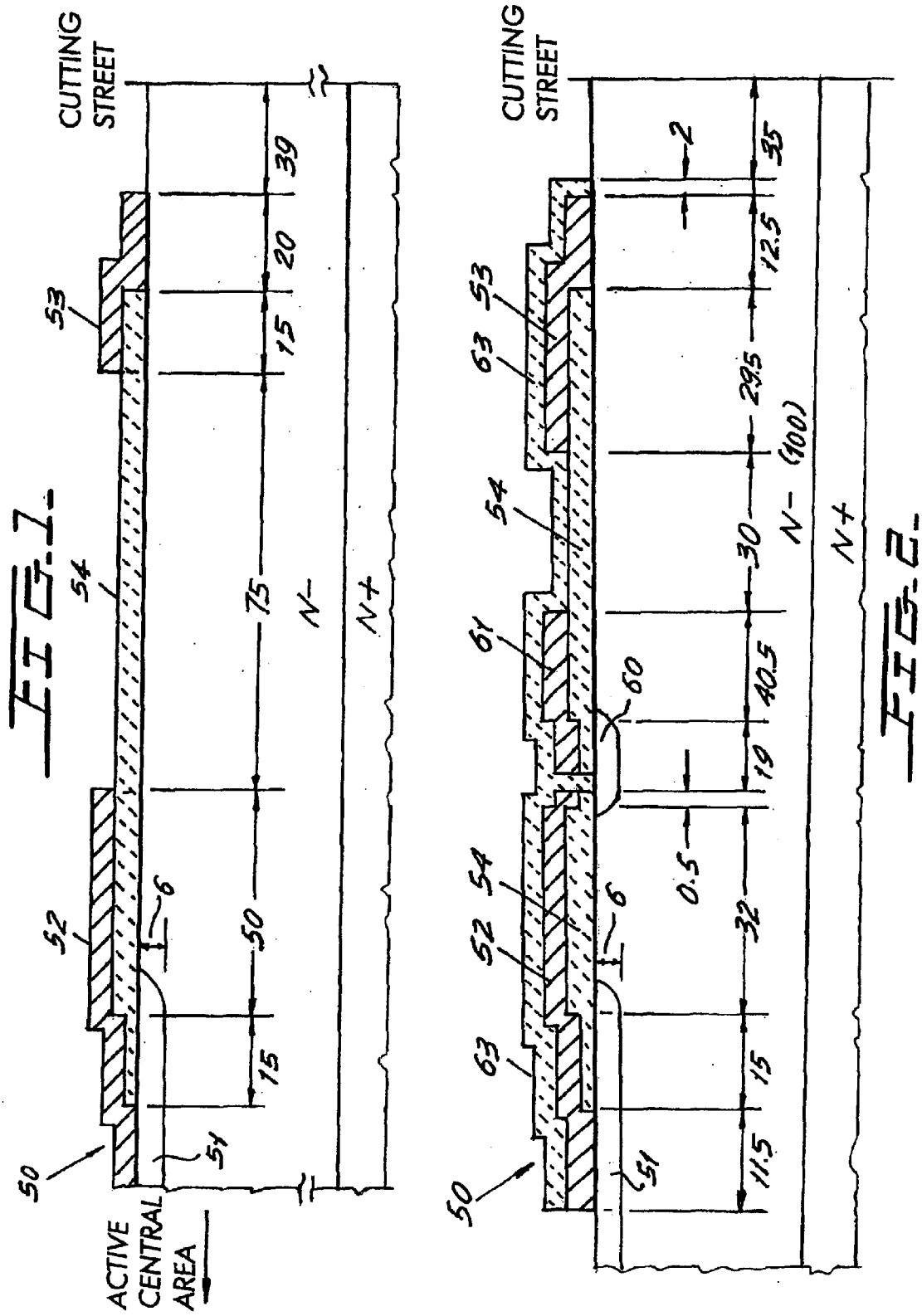

PROCESS FOR FORMING FAST RECOVERY DIODE WITH A SINGLE LARGE AREA P/N JUNCTION

RELATED APPLICATION

This application is a divisional of U.S. patent application Ser. No. 10/115,757, filed Apr. 2, 2002, which is based upon and claims priority to U.S. Provisional Application Ser. No. 60/280,972, filed Apr. 2, 2001.

FIELD OF THE INVENTION

This invention relates to semiconductor devices and processing and more specifically relates to a low cost process for the manufacture of a fast recovery diode and to a novel fast recovery diode structure.

BACKGROUND OF THE INVENTION

Fast recovery diodes are well known. The processes used for the manufacture of such devices frequently employ cellular and/or stripe and/or trench technologies in a silicon die with electron irradiation for lifetime killing. Such devices use a high mask count and are relatively expensive.

It would be desirable to make a fast recovery diode (FRED) with a reduced mask count and lifetime killing but with equal or better characteristics to those of existing FRED devices.

BRIEF DESCRIPTION OF THE INVENTION

In accordance with the invention a novel FRED is formed using a simple single large area junction with platinum lifetime killing. A simplified termination structure is employed using a simple field plate termination at low voltages (200 volts); amorphous silicon on the field plate at intermediate voltage (400 volts); and plural floating guard rings and an equipotential ring in the cutting street in a higher voltage (600 volts) device. Three, four and five masks are used for the 200 volt, 400 volt and 600 volt devices respectively. Excellent characteristics, equivalent to or better than those of existing FREDs with higher mask counts, are obtained.

BRIEF DESCRIPTION OF THE DRAWINGS

FIG. 1 is a cross-section of a portion of a novel FRED die made in accordance with the invention by a 3 mask process for a 200 volt device.

FIG. 2 is a cross-section of a portion of a novel FRED die made in accordance with the invention by a 4 mask process for a 400 volt device.

DETAILED DESCRIPTION OF THE DRAWINGS

Figure 3:
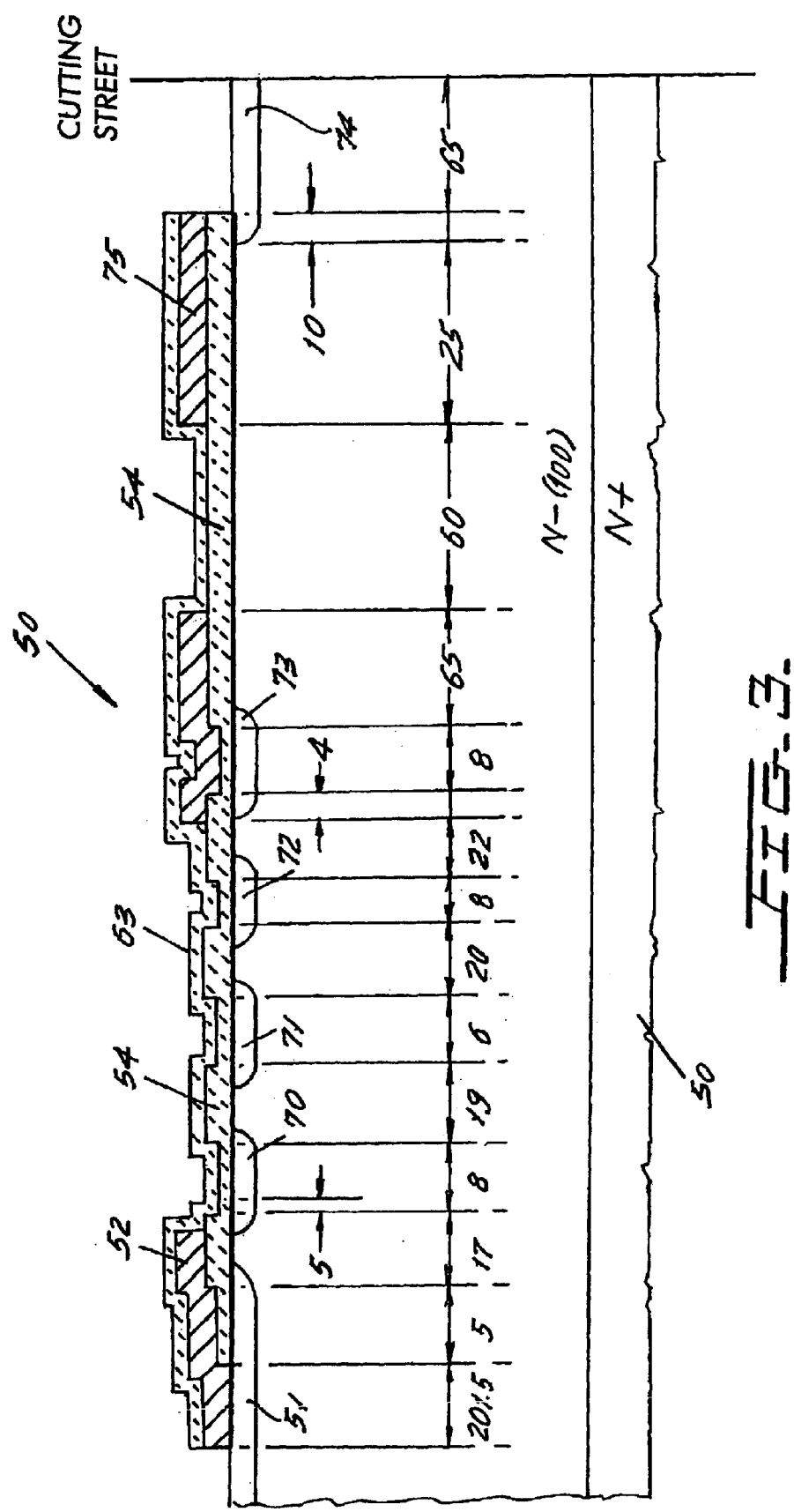
FIG. 3 is a cross-section of a portion of a novel FRED device made in accordance with the invention by a 5 mask process for a 600 volt device.

FIG. 1 shows, in cross-section, a portion of a fast recovery diode die 50 and its termination. The diode consists of a simple large area P type diffusion 51 in an N type epitaxial layer 100 atop the die 50. Diffusion 51 is a boron diffusion having a depth of 6 µm and a peak concentration of $2E19/cm^3$. A field oxide 54 is formed atop the silicon surface and a conductive (aluminum) field plate 52 which is an extension of the anode electrode is also formed. A metal (aluminum) EQR ring 53 completes the termination. An anode contact is connected to the P type diffusion 51 over substantially the full top area of die 50 and a cathode contact (not shown) is connected to its bottom surface. Platinum atoms are diffused into the back surface of the die (wafer) which are driven in from a 10 Å thick layer of platinum for 30 minutes at 950° C. Note that the dimensions on FIG. 1 (and FIGS. 2 and 3) are out of scale and are in microns.

The novel structure of FIG. 1 is made by the following novel 3 mask process of the invention for a FRED rated at 200 volts. The starting wafer has an N+ arsenic doped substrate which has an N− phosphorus doped epitaxial layer 100. The epitaxial layer thickness is 25 µm and has a resistivity of 10 ohm-cm. The process steps used are given in the following Table:

| STEP | NOTE |
| --- | --- |
| Field Ox 54 | Oxide grown to 1.4 um thick |
| MASK 1 | |
| Oxide Etch | BOE Etch; 17 minutes |
| BBr3 Preclean | Time out 2 h before a BBr3 dep |
| BBr3 Dep | Target sheet resistance 55 ohm/square |
| BBr3 Deglass | 4 min etch in 50:1 H2O:HF, 15 min timeout after BBr3 Dep |
| BBr 3 Ox preclean | time out 2 h before BBr3 ox |
| BBr 3 Ox | Target xj = 5 um |
| POC13 dep | Target sheet resistance 14.5 ohm square |
| POC13 deglass | Etch time 1 min. time out after POC13 dep 2 hrs. |
| POC13 OX | Dry oxidation. Oxide thickness 100 A. |
| MASK 2 | (open active area and termination) |
| Oxide Etch | Etch time 15 min |
| Preclean | 50:1 H2O:HF |
| Pt. evap | 10 Å on wafer back. |
| Platinum drive in | 30 min at 950° C. Quick extraction. |
| Preclean | 50:1 H2O:HF |
| Al/Si sputter (52) | Al/Si sputtering, 3 um thickness |
| MASK 3 | |
| Al etch | 7 min in aluminum etch solution |
| Defreckle | 1 min in Ashland Defreckle solution |
| Photoresist Strip | Standard process |
| Al sinter | 30 min, 420° C., Forming gas atmosphere. |
| Wafer Tape | Tape on wafer front |
| Wafer backgrind | 14 mil |
| Wafer detape | Standard process |
| Backside metal | CrNiAg sputtering. |
| Test | Probe Test for 200 V FRED. |

FIG. 2 shows a cross-section like that of FIG. 1, but with a termination modified to make the device a 400 volt device with a 4 mask process. Components similar to those of FIG. 1 have similar identifying numerals.

In order to withstand 400 volts, the device of FIG. 2 employs an added diffusion defining termination P ring 60, an added field plate 61 and an amorphous silicon layer 63 on top of the termination surface, including field plates 52 and 61 and EQR ring 53.

The device of FIG. 2 is made by a novel 4 mask process to increase the device rating to 400 volts. The process begins with a wafer like that of FIG. 1, except that the epitaxial layer 100 is 47 µm thick, and has a resistivity of 15 ohm-cm.

The process for the devices of FIG. 2 starts with steps 1 to 22 above up to ("photorest strip" and before "Al sinter") for the device of FIG. 1. Following step 22, and before Al sinter, a layer 63 of amorphous silicon, 1800 Å thick, is deposited atop the wafer surface. A mask 4 step is then carried out to etch the amorphous silicon to open the active area; specifically, a wet etch (DFK) process.

FIG. 3 is a cross-section like that of FIGS. 1 and 2 with elements added to permit the device to operate at 600 volts. The process used is a 5 mask process. The elements added are P diffusion rings 70 to 73 and N+ diffusion 74 in the cutting street and surrounding the die edge to act as an N+

EQR ring, and a modified metal EQR ring 75. The starting wafer for the 600 volt device has an epitaxial layer 100 thickness of 61 μm and resistivity of 21.5 ohm-cm. The novel 5 mask process for making the device of FIG. 3 employs the steps used for the 400 volt device of FIG. 2, except that a further mask step is used after step 8 above and following the B Br Ox step. Following this added mask step, there is a BOE etch for 17 minutes to open windows for the guard ring diffusions and the process continues as described for FIGS. 1 and 2.

In each of FIGS. 1, 2 and 3, the novel FRED device employs a single large P diffusion for the active area and platinum atoms for life time killing. In FIGS. 2 and 3, the device termination is covered with amorphous silicon.

Although the present invention has been described in relation to particular embodiments thereof, many other variations and modifications and other uses will become apparent to those skilled in the art.

What is claimed is:

1. A reduced mask process for forming a fast recovery diode comprising the steps of forming a field oxide body atop a surface of a semiconductor die; applying a first mask to said field oxide body and etching a large area window therein exposing a portion of said surface of said die and leaving an outer oxide termination ring around said exposed portion; defining a large area P/N junction in said die below said exposed portion; applying a second mask to clear said exposed portion for the application of an anode contact; evaporating platinum metal on an opposing surface of said die and heating said die to drive platinum atoms into said die; depositing metal atop said exposed portion and over the oxide termination ring; and applying a third mask to etch said metal to define an anode contact which overlies said exposed portion and the inner periphery of said termination ring and a separate EQR ring which overlies the outer periphery of said termination ring.

2. The process of claim 1, wherein said platinum metal has a thickness of about 10 Å and is driven at about 950° C. for about 30 minutes.

3. The process of claim 1, which includes the further step of depositing an amorphous silicon layer atop said anode contact and said EQR ring, and a further mask step for removing said amorphous silicon from said anode contact overlying said exposed portion, and leaving said amorphous silicon over said EQR ring and the portion of said anode contact overlying said inner periphery of said oxide termination ring.

4. The process of claim 2, which includes the further step of depositing an amorphous silicon layer atop said anode contact and said EQR ring, and a further mask step for clearing said amorphous silicon from said anode contact overlying said exposed portion, and leaving said amorphous silicon over said EQR ring and the portion of said anode contact overlying said inner periphery of said oxide termination ring.

5. The process of claim 4, which includes a further mask step for defining a plurality of spaced floating guard ring diffusions under said outer oxide termination ring.

6. A reduced mask process for forming a fast recovery diode comprising the steps of forming a field oxide body atop a surface of a semiconductor die; applying a first mask to said field oxide body and etching a large area window therein exposing a portion of said surface of said die and leaving an outer oxide termination ring around said exposed portion; defining a large area P/N junction in said die below said exposed portion; applying a second mask to clear said exposed portion for the application of an anode contact; evaporating platinum metal on an opposing surface of said die and heating said die to drive platinum atoms into said die; depositing metal atop said exposed portion and over the oxide termination ring; and applying a third mask to etch said metal to define an anode contact which overlies said exposed portion and the inner periphery of said termination ring and a separate EQR ring which overlies the outer periphery of said termination ring; and depositing an amorphous silicon layer atop said anode contact and said EQR ring, and a further mask step for removing said amorphous silicon from said anode contact overlying said exposed portion, and leaving said amorphous silicon over said EQR ring and the portion of said anode contact overlying said inner periphery of said oxide termination ring.

* * * * *

UNITED STATES PATENT AND TRADEMARK OFFICE
CERTIFICATE OF CORRECTION

PATENT NO. : 6,927,141 B2
DATED : August 9, 2005
INVENTOR(S) : Kohji Andoh et al.

It is certified that error appears in the above-identified patent and that said Letters Patent is hereby corrected as shown below:

Title page,
Item [75], Inventors, second address should be -- Silvestro Fimiani, Torino (IT) --.

Signed and Sealed this

Eleventh Day of October, 2005

JON W. DUDAS
*Director of the United States Patent and Trademark Office*